United States Patent [19]
Kanamori et al.

[11] Patent Number: 5,614,762
[45] Date of Patent: Mar. 25, 1997

[54] FIELD EFFECT TRANSISTORS HAVING COMB-SHAPED ELECTRODE ASSEMBLIES

[75] Inventors: Mikio Kanamori, Tokyo; Takafumi Imamura, Shiga, both of Japan

[73] Assignee: NEC Corporation, Tokyo, Japan

[21] Appl. No.: 592,663

[22] Filed: Jan. 26, 1996

[30] Foreign Application Priority Data

Jan. 30, 1995 [JP] Japan .................................. 7-13137

[51] Int. Cl.⁶ .................................................. H01L 23/52
[52] U.S. Cl. ........................... 257/69; 257/280; 257/281; 257/471; 257/666; 257/750; 257/758; 257/276

[56] References Cited

U.S. PATENT DOCUMENTS 3,967,305  6/1976  Zuleeg ..................................... 257/265

FOREIGN PATENT DOCUMENTS 0015072  9/1980  European Pat. Off. .
0438693  7/1991  European Pat. Off. .
59-90958  5/1984  Japan .

*Primary Examiner*—Edward Wojciechowicz
*Attorney, Agent, or Firm*—Popham Haik Schnobrich & Kaufman, Ltd.

[57] ABSTRACT

A FET has comb-shaped electrode assemblies for source, drain and gate of the FET. Each of the source and drain electrode assemblies has a plurality of electrodes contacting the active region of the FET and formed as a first layer metal laminate, and a bus bar connecting the electrodes together to a corresponding pad and formed as a second layer metal laminate. The gate electrode layer has a plurality of gate electrodes contacting the active layer in Schottky contact, a gate bus bar connecting the gate electrodes together, a gate pad connected to the gate bus bar. The gate bus bar is formed as a first layer metal laminate intersecting the stem portion of the comb-shaped source bus bar. The two-layer metal structure of the FET reduces the number of photolithographic steps and thereby fabrication costs of the FET.

12 Claims, 12 Drawing Sheets

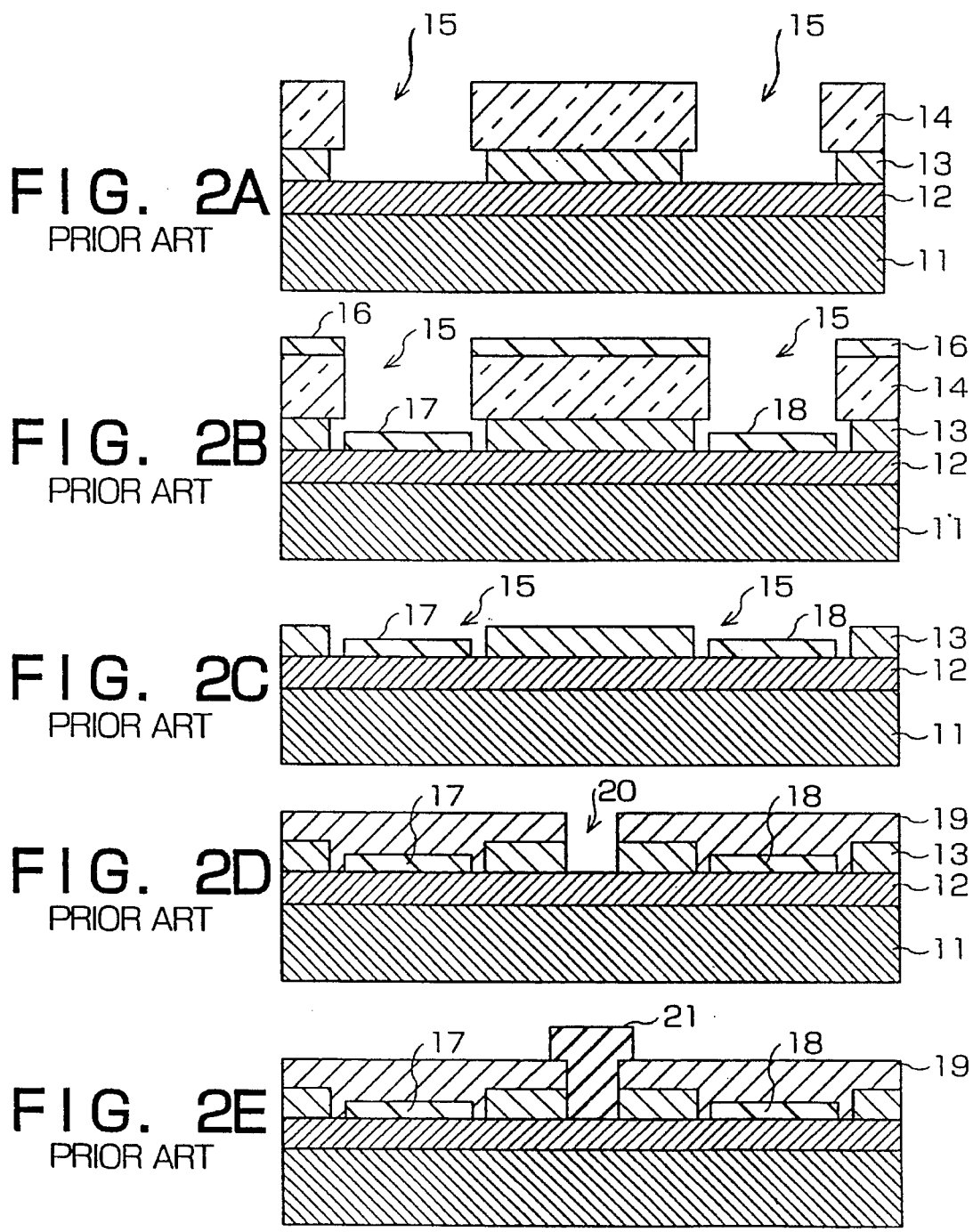

5,614,762

FIELD EFFECT TRANSISTORS HAVING COMB-SHAPED ELECTRODE ASSEMBLIES

BACKGROUND OF THE INVENTION (a) Field of the Invention

The present invention relates to a field effect transistor having comb-shaped electrode assemblies.

(b) Description of the Related Art

Field effect transistors (FET) having comb-shaped electrode assemblies are generally used in a compound semiconductor device. FIG. 1 shows a conventional FET of this type. The FET has a plurality of source electrodes 17, a plurality of drain electrodes 8 and a plurality of gate electrodes 21, all are aligned on an active stripe region 12 in a horizontal direction as viewed in FIG. 1. The plurality of source electrodes 17, plurality of drain electrodes 18 and plurality of gate electrodes 21 are respectively connected in parallel to respective bonding pads 27, 28 and 30 by bus bars 25, 26 and 21A to thereby form comb-shaped electrode assemblies, respectively.

FIGS. 2A to 2G, FIGS. 3A to 3G and FIGS. 4 to 7 show a process for manufacturing the FET of FIG. 1, in which FIGS. 2A to 2G are cross-sections taken along line A–A' while FIGS. 3A to 3G are cross-sections taken along line B–B' in consecutive steps of the process, and in which FIGS. 4 to 7 are plan views of the FET of FIG. 1 in the consecutive steps. Detailed structure of the conventional FET of FIG. 1 will be described through description of the process thereof with reference to those drawings.

A stripe n-GaAs region 12 is formed on a selected portion of a semi-insulating GaAs substrate 11, following which a first insulator layer 13 made of $SiO_2$, for example, is deposited on the entire surface of the substrate 11 including the surface of the stripe n-GaAs region 12. The first insulator layer 13 is then selectively removed by an etching step using a photoresist pattern 14 as a mask, to thereby form openings 15 for receiving therein source and drain electrodes. FIGS. 2A and 3A show this stage of the FET.

A first layer metal laminate 16, 17 and 18 including consecutively, as viewed from the bottom, AuGe, Ni, and Au (AuGe/Ni/Au) films is deposited by evaporation onto the entire surface including the surfaces of the photoresist pattern 14 and the stripe n-GaAs region 12 in the opening 15, as shown in FIGS. 2B and 3B. The first layer metal laminate 16 on the photoresist pattern 14 is then removed by a lift-off method through removing the photoresist pattern 14, as shown in FIGS. 2C and 3C. Thereafter, a thermal treatment of the first layer metal laminate 17 and 18 on the stripe n-GaAs layer 12 is effected to form an alloy, thereby obtaining the source and drain electrodes 17 and 18 which contact the active stripe n-GaAs region 12 by way of ohmic contact. The metal patterns 17 and 18 as obtained by those steps are shown in FIG. 4.

A second insulator layer 19 made of $SiO_2$ is deposited on the entire surface, and the first and second insulator layers 13 and 19 are selectively etched to form openings 20 therein (FIGS. 2D, 3D and 5). Thereafter, a second layer metal laminate 21 including consecutively, as viewed from the bottom, WSi and Au (WSi/Au) films is deposited by sputtering and patterned to form a comb-shaped gate structure including a plurality of gate electrodes 21 formed on the stripe n-GaAs region 12 and a gate bus bar 21A formed on the semi-insulating substrate 11, as shown in FIGS. 2E, 3E and 6. The gate electrodes 21 contact the n-GaAs layer 12 by way of a Schottky contact.

Subsequently, a third insulator layer 23 made of $SiO_2$ is formed on the entire surface including the surfaces of the gate structure 21 and 21A and the second insulator layer 19. The second and third insulator layers 19 and 23 are then selectively and consecutively etched to form therein openings 24 for exposing the source electrodes 17 and drain electrodes 18 and an opening 29 for gate bus bar (FIGS. 2F, 3F and 7). Thereafter, a third layer metal laminate made of WSi/Au films is deposited by sputtering onto the entire surface, then selectively etched to form a gate pad 30 on the gate bus bar 21A, a comb-shaped source bus bar 25 having a pair of source pads 27, and a comb-shaped drain bus bar 26 having a drain pad 28, as shown in FIGS. 1, 2G and 3G.

The conventional compound FET as described heretofore has a three-layer metal structure including the first layer implementing the source electrodes 17 and drain electrodes 18, the second layer implementing the gate structure 21 and 21A, and the third layer implementing the source and drain bus bars 25 and 27 connecting the source electrodes and drain electrodes together, respectively, and the gate pad 30. The three-layer metal structure of the FET requires a large number (six) of photolithographic steps for metal and insulator layers, thereby raising the fabrication costs of the FET.

SUMMARY OF THE INVENTION

In view of the above, an object of the present invention is to provide a compound FET having comb-shaped electrodes, which can be formed at a relatively low cost due to a reduced number of photolithographic steps.

The present invention is directed to a FET comprising a substrate; a semiconductor active layer formed on the substrate; a source electrode assembly including a source bus bar and a plurality of source electrodes each connected to the source bus bar and contacting a first portion of the active layer in ohmic contact; a drain electrode assembly including a drain bus bar and a plurality of drain electrodes each connected to the drain bus bar and contacting a second portion of the active layer in ohmic contact; a gate electrode assembly including a gate bus bar, a plurality of gate electrodes each contacting a third portion of the active layer in Schottky contact, and a plurality of gate lead-in portions connecting respective gate electrodes to the gate bus bar, the third portion being disposed between the first portion and second portion.

The first aspect of the present invention provides a FET wherein the source electrodes, drain electrodes, and gate bus bar are formed as a first layer metal, and wherein the gate electrodes, gate lead-in portions and the source and drain bus bars are formed as a second layer metal overlying the first layer metal.

The second aspect of the present invention provides a FET wherein the source electrodes, drain electrodes, and gate lead-in wires are formed as a first layer metal, the gate electrodes, and the source, drain and gate bus bars are formed as a second layer metal overlying the first layer metal.

In accordance with the present invention, the FET has two-layer metal structure which reduces the number of photolithgraphic steps and reduce the fabriction cost of the FET.

The above and other objects, as well as features and advantages of the present invention will be more apparent from the following description, referring to the accompanying drawings.

BRIEF DESCRIPTION OF THE DRAWINGS

FIGS. 2A to 2G are cross-sectional views of the FET of FIG. 1 for showing consecutive steps of a method for manufacturing the FET, taken along line A—A' in FIG. 1;

DESCRIPTION OF THE PREFERRED EMBODIMENTS

Figure 1:
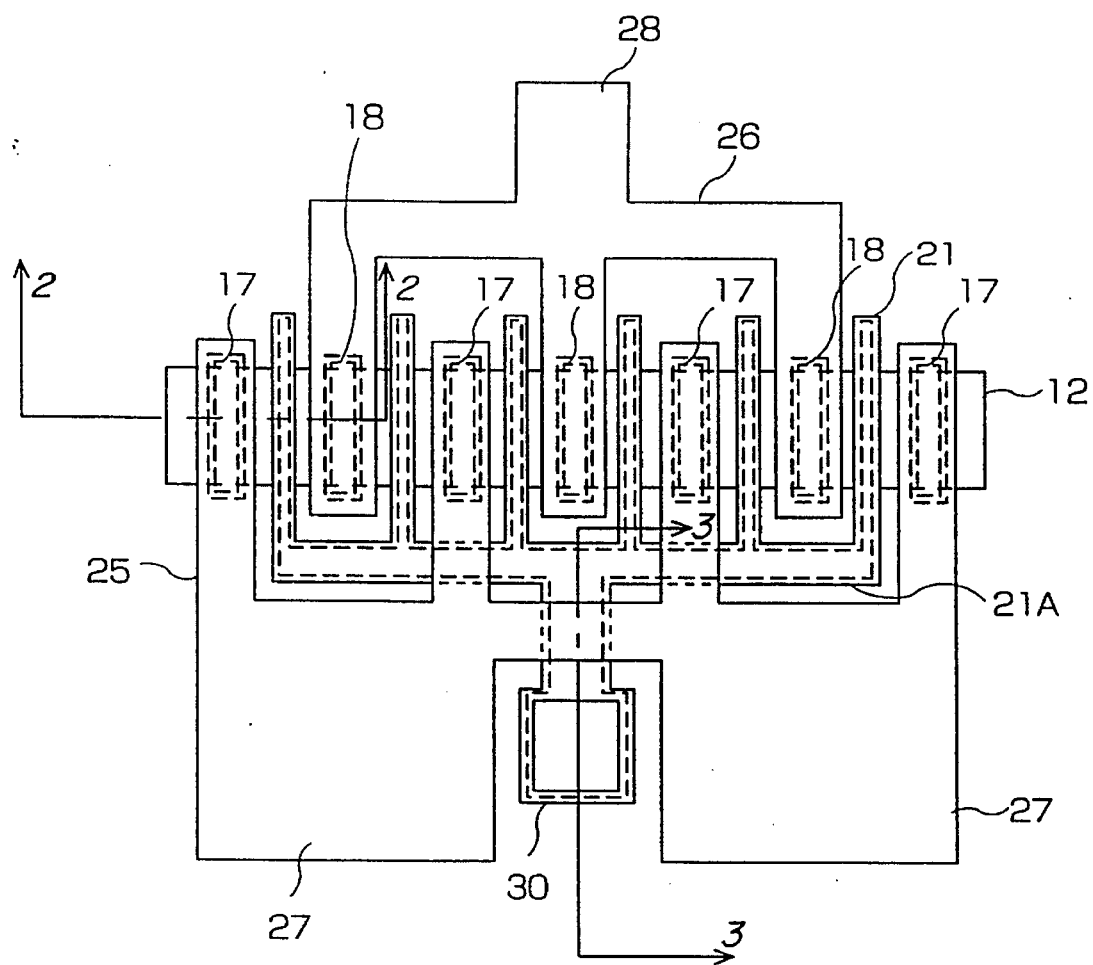
FIG. 1 is a schematic plan view of a conventional FET for showing a pattern layout of metal layers.
Figure 2F:
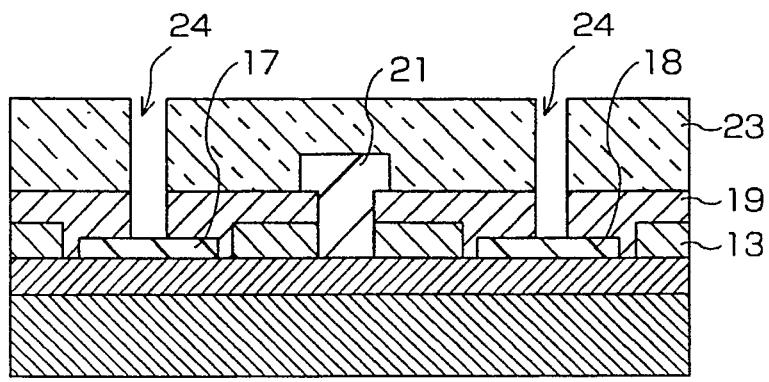
Figure 2G:
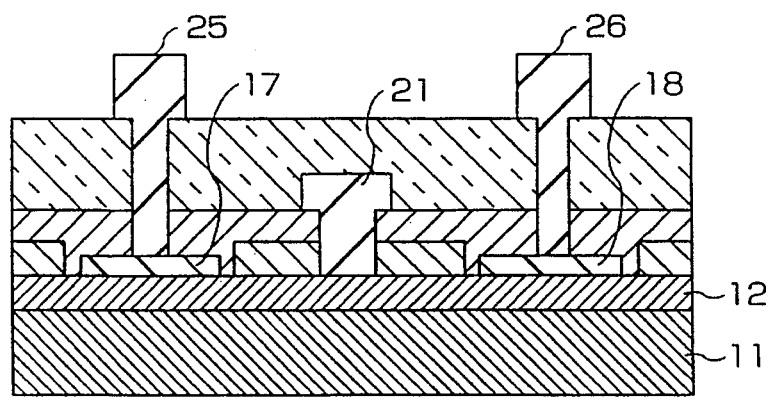
Figure 3A:
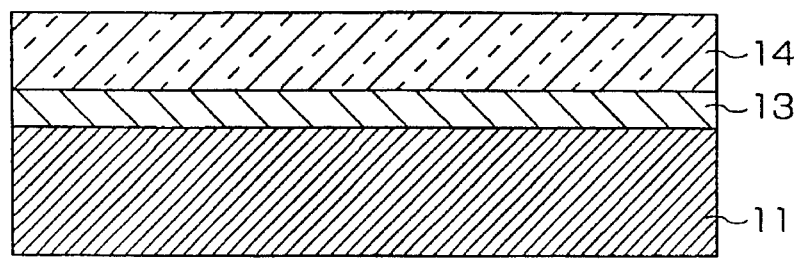
FIGS. 3A to 3G are cross-sectional views of the FET of FIG. 1 for showing consecutive steps of the method for manufacturing the FET, taken along line B—B' in FIG. 1.
Figure 3B:
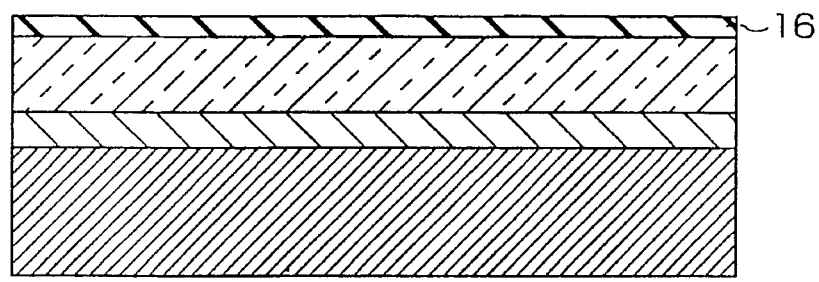
Figure 3C:
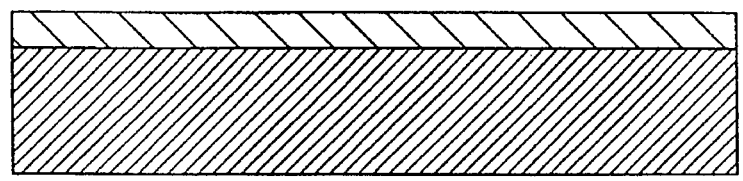
Figure 3D:
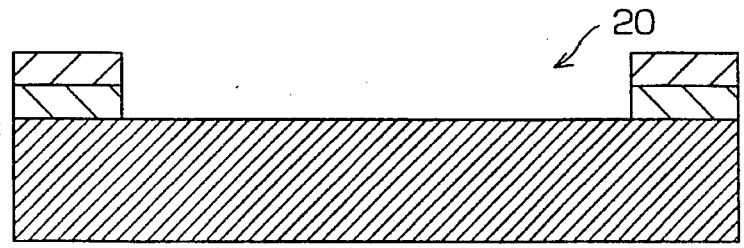
Figure 3E:
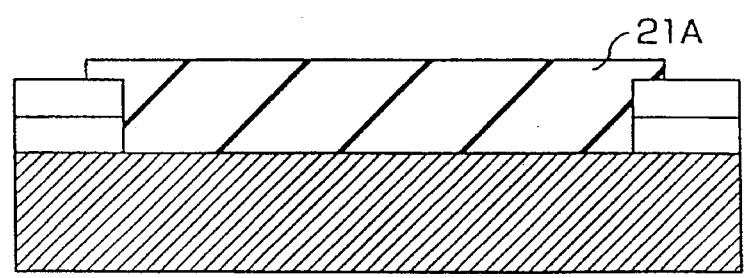
Figure 3F:
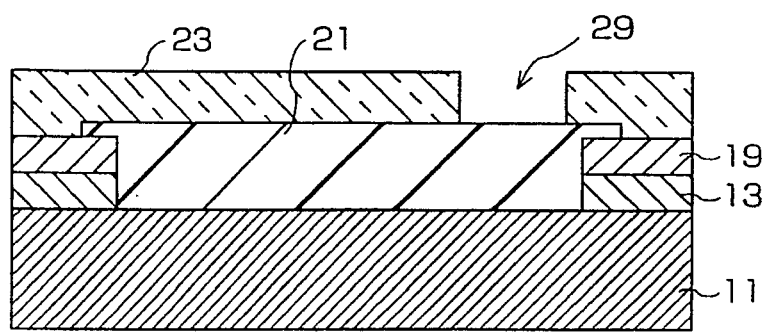
Figure 3G:
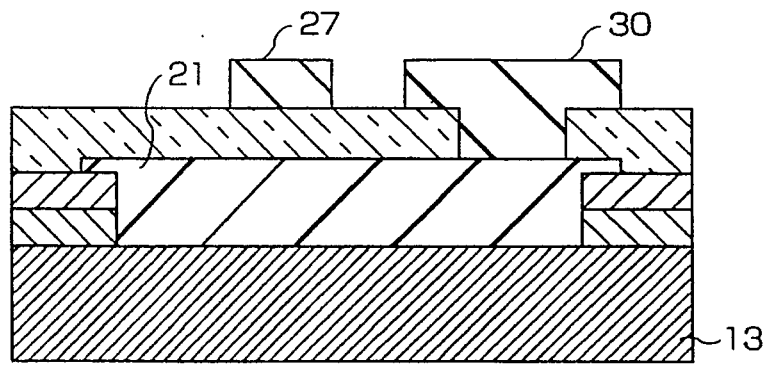
Figure 4:
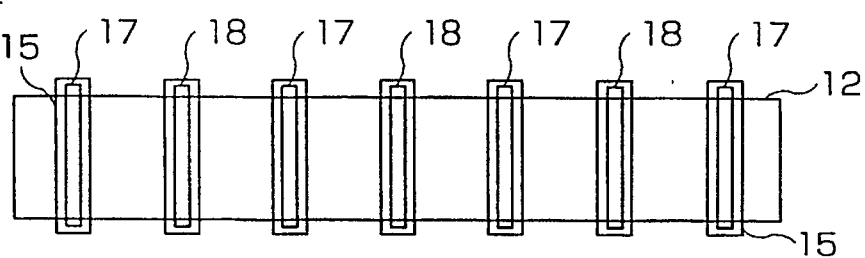
FIGS. 4 to 7 are schematic plan views for showing a pattern layout of metal layers in the FET of FIG. 1 in consecutive steps of the method for manufacturing the FET.
Figure 5:
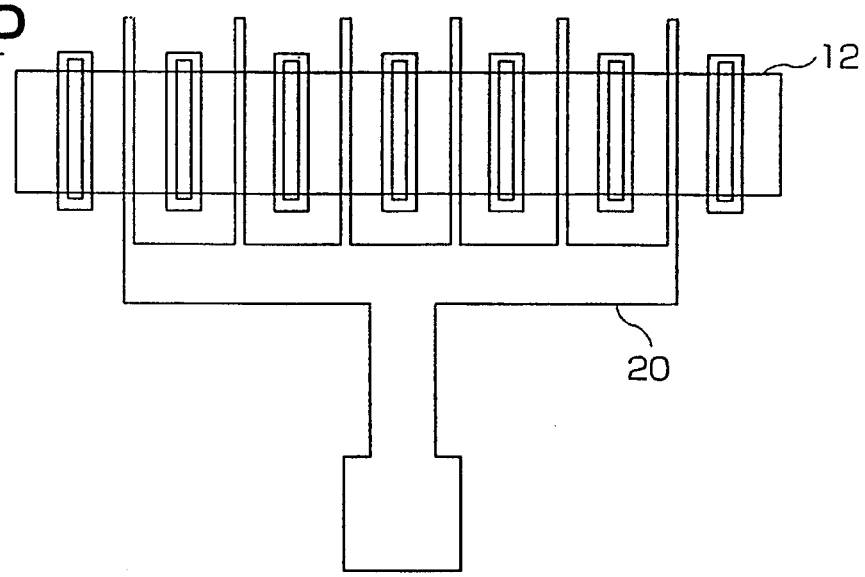
Figure 6:
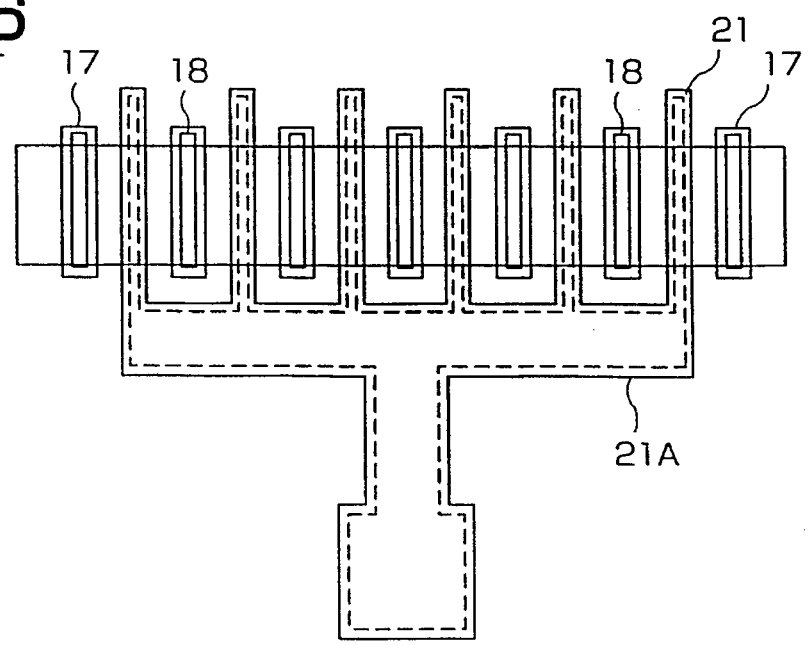
Figure 7:
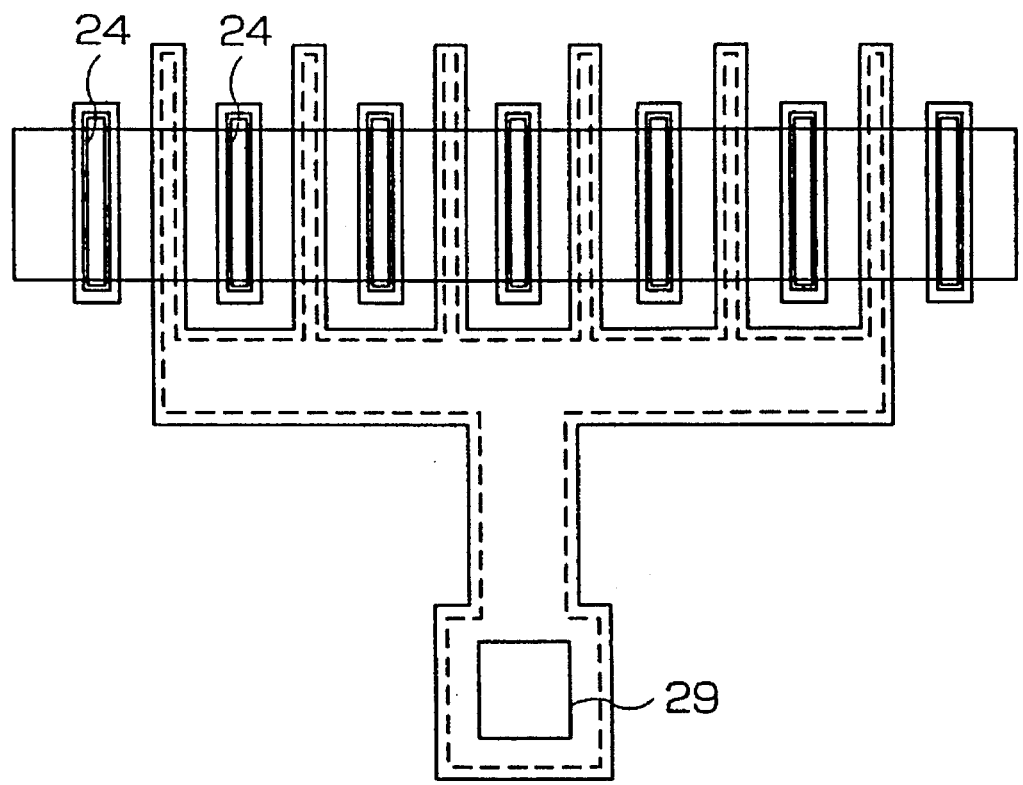
Figure 8:
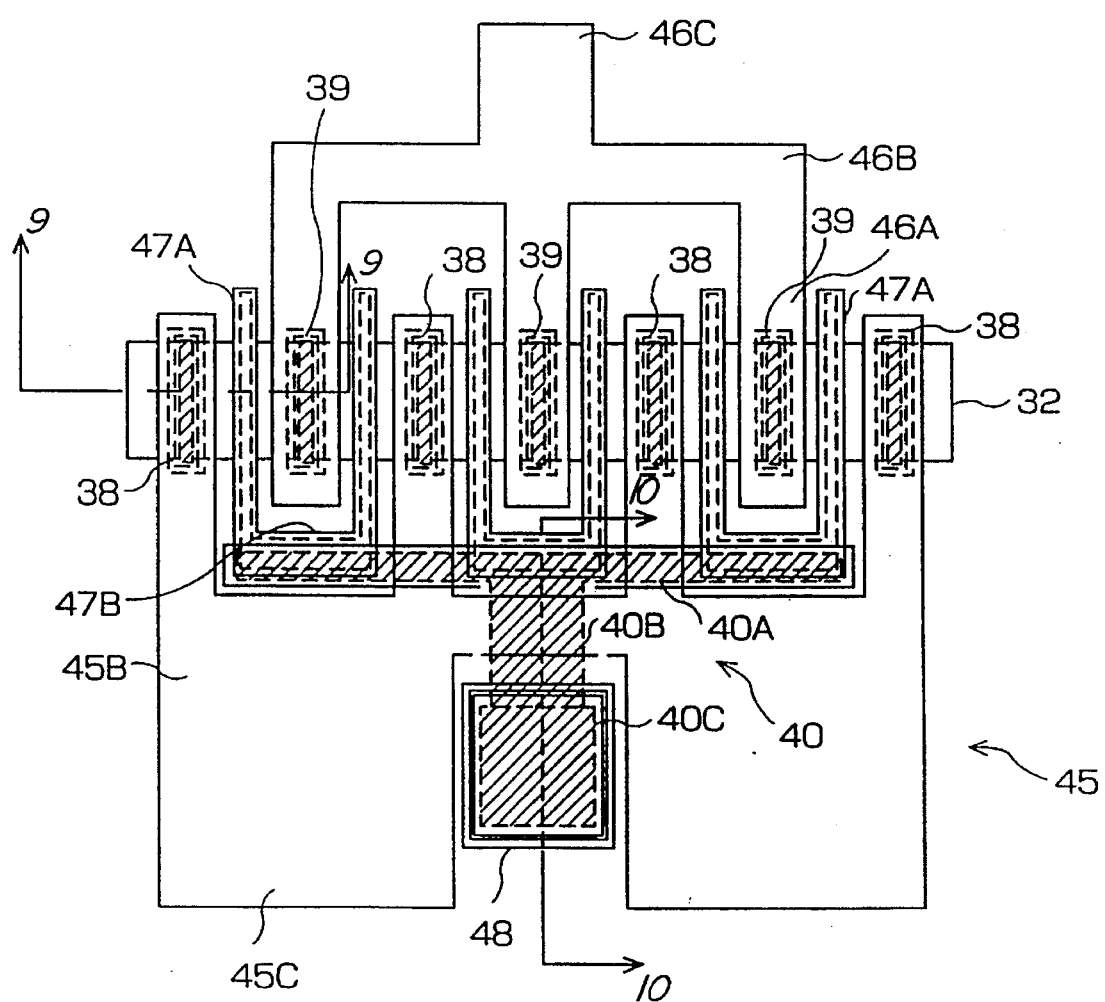
FIG. 8 is a schematic plan view of a FET according to a first embodiment of the present invention for showing a pattern layout of metal layers in the FET.

Now, the present invention will be described with reference to the accompanying drawings. FIG. 8 shows a FET according to the first embodiment of the present invention. The FET has a stripe n-GaAs region 32 formed on a semi-insulating GaAs substrate, a source electrode assembly including a plurality of source electrodes 38, a drain electrode assembly including a plurality of drain electrodes 39 and a gate electrode assembly including a plurality of gate electrodes 47A. Source and drain electrodes 38 and 39 contact respective portions of the stripe n-GaAs region 32 in ohmic contact while the gate electrodes 47A contact respective portions of the stripe n-GaAs region 32 in Schottky contact. Each of the source, drain and gate assemblies is formed to have a comb shape.

The detailed structure of the FET according to the first embodiment will be described by way of the process for manufacturing the same with reference to FIGS. 9A to 9G, 10A to 10G, 11 and 12.

FIGS. 9A to 9G show the structure of the FET along line A—A' in FIG. 8 while FIGS. 10A to 10G show the structure of the FET along line B—B' in FIG. 8. To start the process for manufacturing the FET of FIG. 8, Si ions are selectively introduced by an ion-implanting technology into a selected portion of the main surface of a semi-insulating substrate 31, with an acceleration energy of 200 keV and a dosage of $5 \times 10^{12}$ cm$^{-2}$, following which a heat treatment is effected in an argon (Ar) atmosphere at a temperature of 800 °C. By these steps, the stripe n-GaAs active region 32 for the FET is formed on the main surface of the semi-insulating substrate 31. Subsequently, a first insulator layer 33 made of SiO$_2$ is deposited by a CVD technology onto the entire surface of the semi-insulating substrate 31 including the stripe n-GaAs region 32, followed by spin-coating and subsequent patterning of a photoresist layer 34. The insulator layer 33 is patterned by using the photoresist layer 34 as a mask to form openings 35 in the first insulator layer 34 at the locations for forming source electrodes, drain electrodes, and a gate bus bar including a bottom gate pad.

Figure 9A:
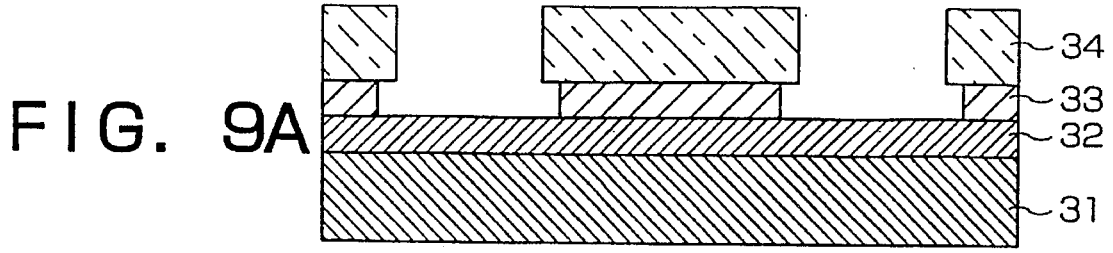
FIGS. 9A to 9E are cross-sectional views of the FET of FIG. 8 for showing consecutive steps of a method for manufacturing the FET, taken along line A—A' in FIG. 8.
Figure 9B:
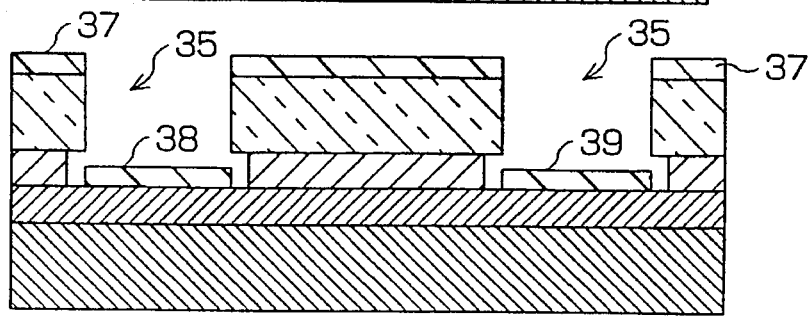
Figure 10A:
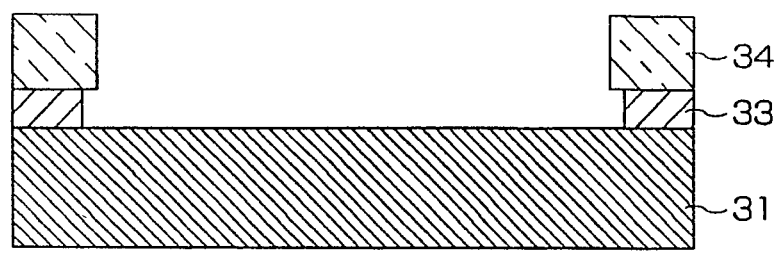
FIGS. 10A to 10E are cross-sectional views of the FET of FIG. 8 for showing consecutive steps of the method for manufacturing the FET, taken along line B—B' in FIG. 8.
Figure 10B:
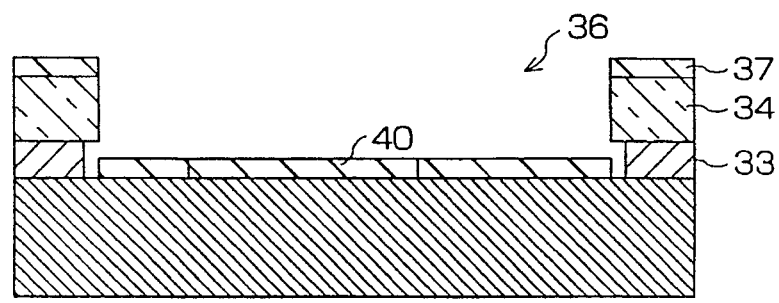

A first layer metal laminate including consecutively, as viewed from the bottom, a 0.15 μm thick AuGe film, a 0.05 μm thick Ni film and 0.1 μm thick Au film and designated by reference numerals 37 through 40 is formed by evaporation on the entire surface including the surfaces of the photoresist layer 34, the n-GaAs region 32 and the semi-insulating substrate 31 in the openings 35 and 36, as shown in FIGS. 9B and 10B.

Figure 9C:
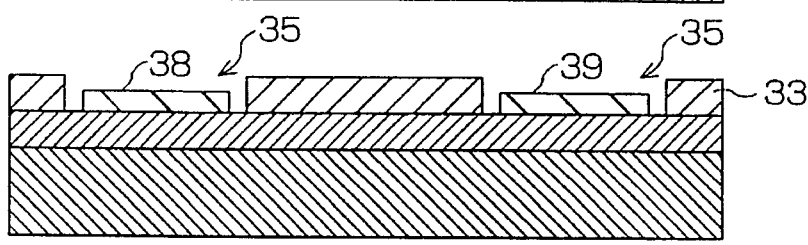
Figure 10C:
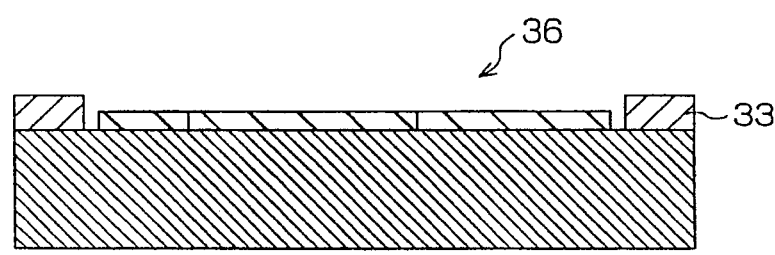
Figure 11:
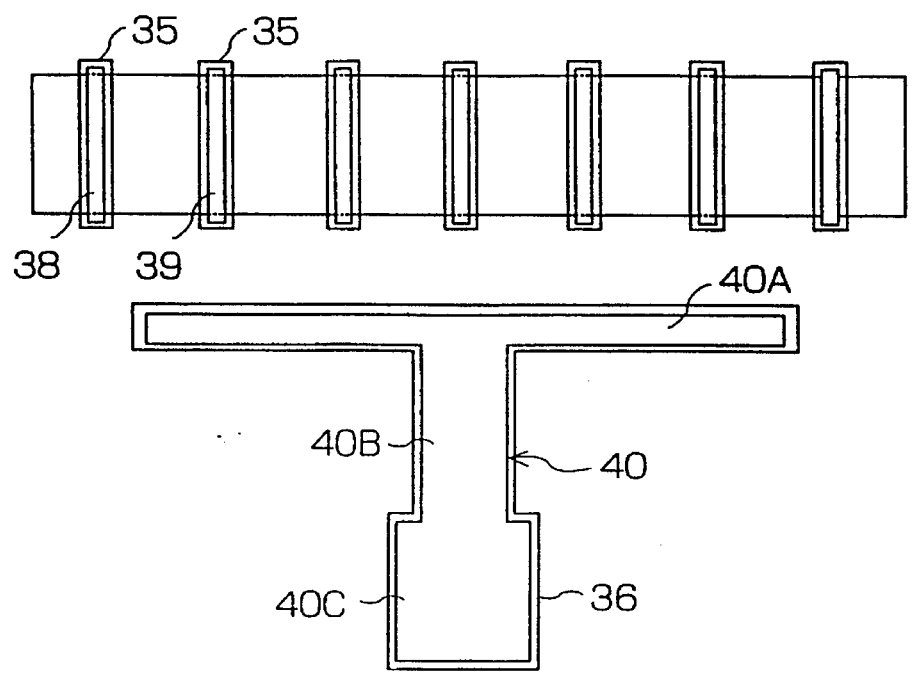
FIGS. 11 and 12 are schematic plan views of a pattern layout of metal layers in the FET of FIG. 8 in consecutive steps of the method for manufacturing the FET.

The first layer metal laminate 37 formed on the photoresist layer 34 is then removed by lifting off the photoresist layer 34. Then, the metal laminates 38 and 39 formed on the stripe n-GaAs region 32 are heat-treated at a temperature of about 400° C. to form a plurality of alloy source electrodes 38 and drain electrodes 39 in ohmic-contact with the stripe n-GaAs region 32. These steps provide the structure as shown in FIGS. 9C, 10C and 11. The source electrodes 38 and drain electrodes 39 are arranged alternately on the stripe n-GaAs region 32. The gate bus bar 40 formed on the semi-insulating substrate 31 has a linear portion 40A extending parallel to one of the sides of the n-GaAs region 32, a bottom gate pad 40C and a bar portion 40B connecting the linear portion 40A to the bottom gate pad 40C, as shown in FIG. 11.

Figure 9D:
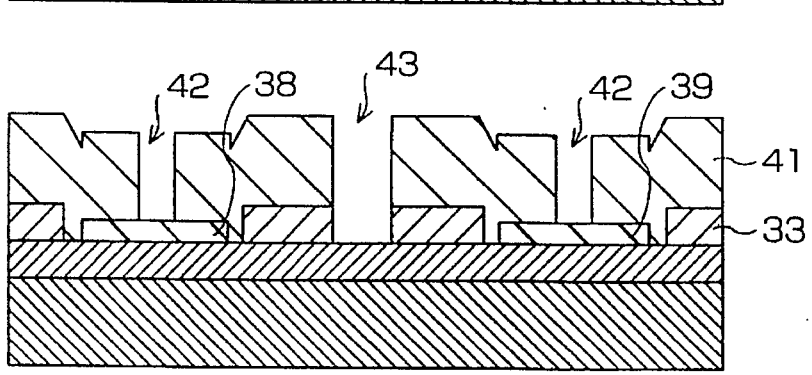
Figure 10D:
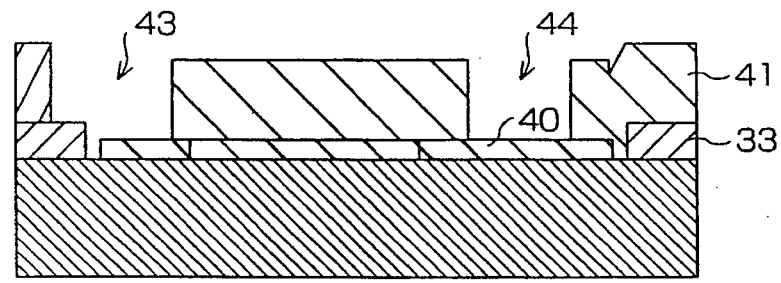
Figure 12:
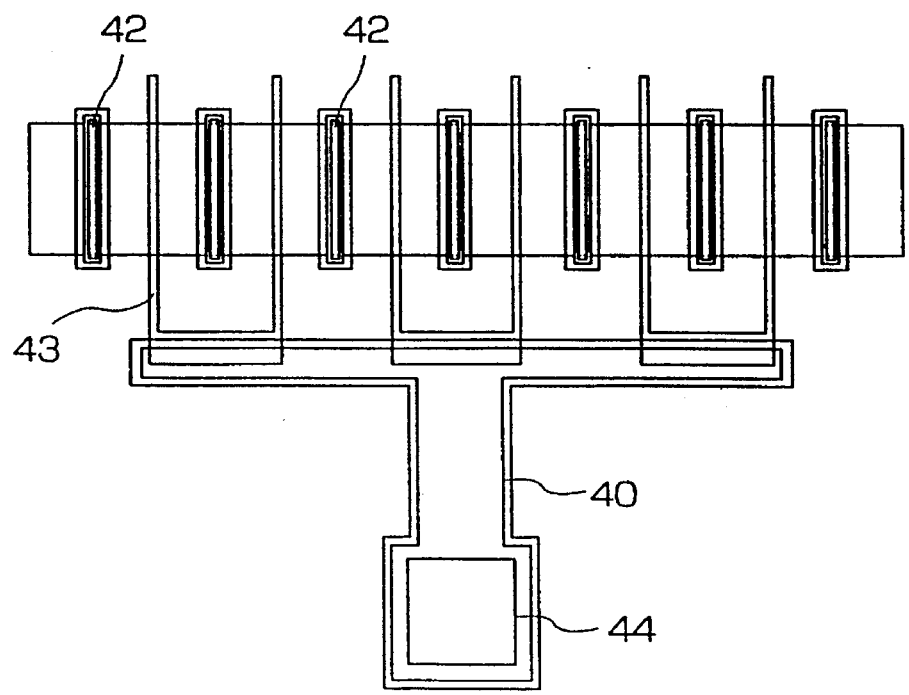

Thereafter, a second insulator layer 41 made of SiO$_2$ having a thickness of 0.5 μm is deposited by CVD on the entire surface including the surfaces of the first insulator layer 33 and bottom of the openings 35 and 36. Subsequently, the first and second insulator layers 33 and 41 are selectively removed by a dry-etching method using CF$_4$ gas to thereby form openings 42 exposing the source and drain electrodes 38 and 39, openings 43 for forming gate electrodes and an opening 44 exposing the bottom gate pad 40C of the gate bus bar 40, as shown in FIGS. 9D, 10D and 12. Each of the openings 43 for the gate electrodes has a shape and location such that each two of the resultant gate electrodes are connected by a linear section formed on the linear portion 40A of the gate bus bar 40. It is preferable that, in order to obtain reproducible and reliable FET characteristics, the dry-etching is effected by a mixed gas containing a strongly reactive gas such as NF$_3$ or effected under a reduced acceleration energy during the dry-etching.

Figure 9E:
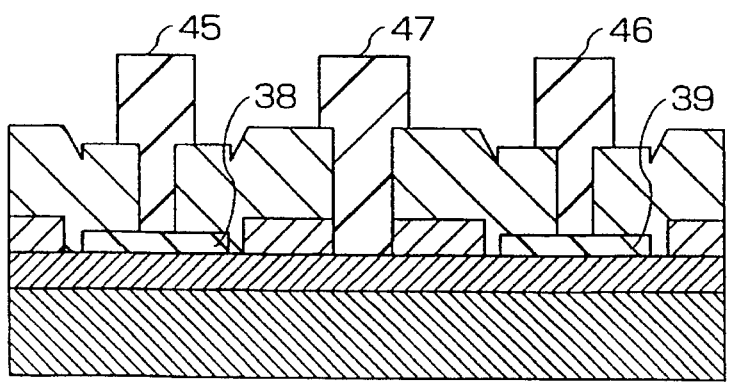
Figure 10E:
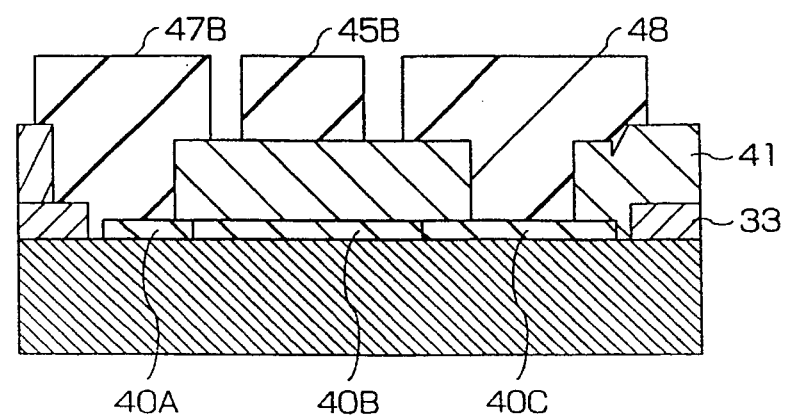

A second layer metal laminate including consecutively, from the bottom, a 0.1 μm thick WSi film and a 1 μm thick Au film is deposited on the entire surface including the bottom of the openings 42 through 44 in the second insulator layer 41 by sputtering. Then, the second layer metal laminate is patterned to form a source bus bar 45 formed on the source electrodes 38, a drain bus bar 46 formed on the drain electrodes 39, a plurality of gate pieces 47 each including two gate electrodes 47A formed on the stripe n-GaAs region 32 and a gate lead-in portion 47B connecting the two gate electrodes 47A to the linear portion 40A of the gate bus bar 40, and a top gate pad 48 formed on the bottom gate pad 40C of the gate bus bar 40, as shown in FIGS. 9E, 10E and 8. The bottom of each of the gate electrodes 47A forms a Schottky contact between the same and the stripe n-GaAs layer 32 at the location between the corresponding source region and drain region. In FIG. 8, the first layer metal is shown to have hatching thereon, for a better understanding of the drawing.

By the process as described above, the FET is formed such that the gate electrode assembly has a comb shape as a whole, as viewed in the vertical direction, while each of the source and drain bus bars 45B and 46B is of a comb shape having teeth contacting the source electrodes 38 or drain electrodes 39 at the bottom of the teeth and a stem portion for connecting the source electrodes 38 or drain electrodes 39 together. The comb-shaped source and drain bus bars are arranged such that the stem portions of both the comb-shaped source and drain bus bars are opposed to each other, and such that the teeth of the comb-shaped source bus bar 45B are disposed alternately with the teeth of the comb-shaped drain bus bar 46B, with the respective teeth of the comb-shaped gate electrode assembly being disposed therebetween, as shown in FIG. 8. Further, the stem portion of the comb-shaped source bus bar 45B intersects the bar portion 40B of the gate bus bar 40 while insulated therefrom, the bar portion being formed as a first layer metal, which is connected to the top gate pad 48 formed as a second layer metal.

Referring back to FIGS. 9E and 10E, in some cases, the second layer metal laminate including WSi/Au films cannot be well removed from the surface of the second insulator layer 41 during the etching process of the second layer metal laminate. This is because the portions of the metal laminate adhering to step portions of the second insulator layer are difficult to remove. To avoid these cases, the second insulator layer 41 should be smoothed by equalizing the thickness of the underlying first insulator layer 33 with the thickness of the underlying first metal laminates 38, 39 and 40, which will be understood by inspecting FIGS. 9D and 10D.

Figure 13:
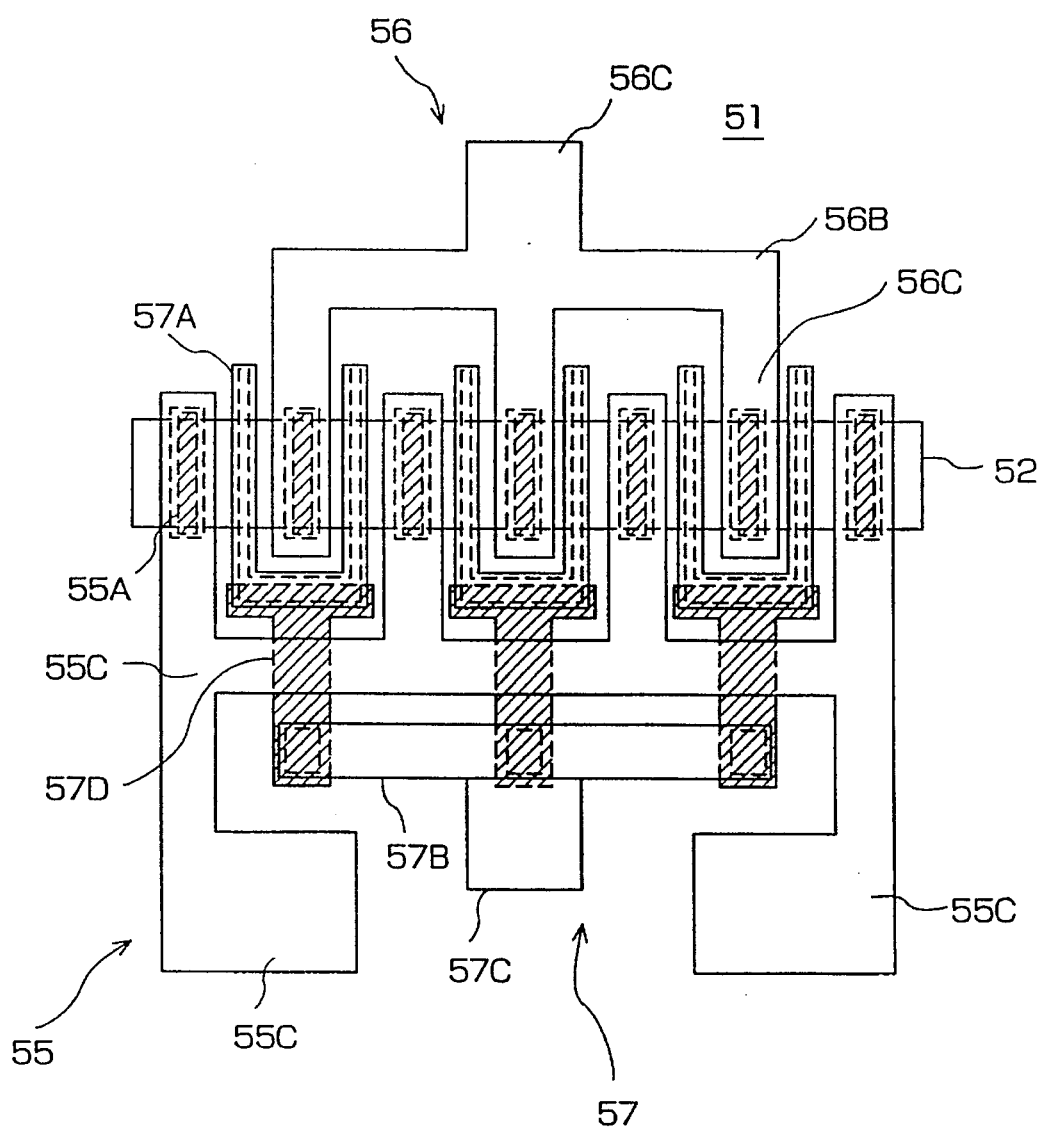
FIG. 13 is a schematic plan view of a FET according to a second embodiment of the present invention for showing a pattern layout of metal layers in the FET.

FIG. 13 shows, similarly to FIG. 8, a FET according to a second embodiment of the present invention. The first layer metal is also shown to have hatching thereon. The FET includes a stripe n-GaAs region 52 formed on a semi-insulating GaAs substrate 51, a source electrode assembly 55, a drain electrode assembly 56 and a gate electrode assembly 57. Each of the electrodes assemblies 55, 56 and 57 has a comb shape, with the teeth thereof being the electrodes contacting the stripe n-GaAs region 52 and with the stem portion thereof being a bus bar connecting corresponding electrodes together.

The source electrode assembly 55 includes a plurality of source electrodes 55A, source bus bar 55B connecting the source electrodes 55A together, and a pair of source pad 55C each extending from the source bus bar 55B. The drain electrode assembly 56 includes a plurality of drain electrodes 56A, a drain bus bar 56B connecting the drain electrodes 56A together, and a drain pad 56C protruding from the drain bus bar 56B at the central portion thereof. The gate electrode assembly 57 includes a plurality of gate electrode pieces 57A each having two gate electrodes and a bridge portion connecting the two gate electrodes together, a plurality of gate lead-in portion 57D connected to respective gate electrode pieces 57A, a gate bus bar 57B connected to the gate lead-in portions 57D, and a gate pad 57C protruding from the gate bus bar 57B at the central portion thereof.

The source electrodes 55A, drain electrodes 56A and gate lead-in portions 57D constitute a first layer metal laminate formed on the stripe n-GaAs region 52 or semi-insulating substrate, while the source bus bar 55B, source pads 55C, drain bus bar 56B, drain pad 56C, gate electrodes 57A, gate bus bar 57B and gate pad 57C constitute a second layer metal laminate. In this configuration, the plurality of gate lead-in portions 57D connect respective gate pieces having two gate electrodes 57A to the gate bus bar 57B, so that each of the gate lead-in portions 57D, which intersect the stem portion of the source bus bar 55B while insulated therefrom, need not have a large thickness compared to the first embodiment because of small current flowing through the gate lead-in portions 57D. Namely, the intersections between the gate lead-in portions 57D and the stem portion of the source bus bar 55B have a reduced thickness to thereby prevent generation of step portions of tile second insulator layer at the intersections.

As described above, with the FETs according to the embodiments of the present invention, two metal laminates are sufficient to implement the source, drain and gate electrode assemblies, thereby reducing the number of photolithographic steps and fabrication costs of the FET.

Since above embodiments are described only for examples, the present invention is not limited to such embodiments and it will be obvious for those skilled in the art that various modifications or alterations can be easily made based on the above embodiments within the scope of the present invention. For example, the arrangement of the source electrodes and drain electrodes may be reversed.

What is claimed is:

1. A field effect transistor comprising a substrate; a semiconductor active layer formed on said substrate; a source electrode assembly including a source bus bar and a plurality of source electrodes each connected to said source bus bar and contacting a first portion of said active layer in ohmic contact; a drain electrode assembly including a drain bus bar and a plurality of drain electrodes each connected to said drain bus bar and contacting a second portion of said active layer in ohmic contact; a gate electrode assembly including a gate bus bar, a plurality of gate electrodes each contacting a third portion of said active layer in Schottky contact, and a plurality of gate lead-in portions connecting respective said gate electrodes to said gate bus bar, said third portion being disposed between said first portion and second portion, said source electrodes, drain electrodes, and gate bus bar being formed as a first layer metal, said gate electrodes, gate lead-in portions and said source and drain bus bars being formed as a second layer metal overlying said first layer metal.

2. A field effect transistor as defined in claim 1 wherein each of said source and drain bus bars is formed to have a comb shape, and said plurality of gate lead-in portions and gate bus bar as combined are formed to have a comb shape.

3. A field effect transistor as defined in claim 1 wherein each of said electrode assemblies further has a pad connected to a corresponding one of said bus bars and constituting said second layer metal.

4. A field effect transistor as defined in claim 1 wherein said first layer metal is made of a laminate including an AuGe film, a Ni film and an Au film.

5. A field effect transistor as defined in claim 1 wherein said second layer metal is made of a laminate including a WSi film and an Au film.

6. A field effect transistor as defined in claim 1 wherein each of said gate lead-in portions is provided for each two of said gate electrodes.

7. A field effect transistor comprising a substrate; a semiconductor active layer formed on said semiconductor substrate; a source electrode assembly including a source bus bar and a plurality of source electrodes each connected to said source bus bar and contacting a first portion of said active layer in ohmic contact; a drain electrode assembly including a drain bus bar and a plurality of drain electrodes each connected to said drain bus bar and contacting a second portion of said active layer in ohmic contact; a gate electrode assembly including a gate bus bar, a plurality of gate electrodes each contacting a third portion of said active layer in Schottky contact, and a plurality of gate lead-in portions connecting respective said gate electrodes to said gate bus bar, said third portion being disposed between said first portion and second portion, said source electrodes, drain electrodes, and gate lead-in portions being formed as a first layer metal, said gate electrodes, and said source, drain and gate bus bars being formed as a second layer metal overlying said first layer metal.

8. A field effect transistor as defined in claim 7 wherein each of said source and drain bus bars is formed to have a comb shape, and said plurality of gate lead-in portions and gate bus bar as combined are formed to have a comb shape.

9. A field effect transistor as defined in claim 7 wherein said gate electrode assembly further has a gate pad connected to said gate bus bar and constituting said second layer metal.

10. A field effect transistor as defined in claim 7 wherein said first layer metal is made of a laminate including an AuGe film, a Ni film and an Au film.

11. A field effect transistor as defined in claim 7 wherein said second layer metal is made of a laminate including a WSi film and an Au film.

12. A field effect transistor as defined in claim 7 wherein each of said gate lead-in portions is provided for each two of said gate electrodes.

* * * * *